United States Patent
Lin

(10) Patent No.: US 9,847,254 B2
(45) Date of Patent: Dec. 19, 2017

(54) FINGERPRINT SENSOR CHIP PACKAGE STRUCTURE AND MANUFACTURING METHOD THEREOF

(71) Applicant: ChipMOS Technologies Inc., Hsinchu (TW)

(72) Inventor: Shih-Hsi Lin, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 144 days.

(21) Appl. No.: 14/880,286

(22) Filed: Oct. 12, 2015

(65) Prior Publication Data
US 2016/0364592 A1  Dec. 15, 2016

(30) Foreign Application Priority Data
Jun. 11, 2015 (TW) .............................. 104118906 A

(51) Int. Cl.
*G06K 9/00* (2006.01)
*H01L 21/56* (2006.01)
(Continued)

(52) U.S. Cl.
CPC ...... *H01L 21/76898* (2013.01); *G06K 9/0002* (2013.01); *G06K 9/00053* (2013.01);
(Continued)

(58) Field of Classification Search
CPC .... G06K 9/00–9/0012; G06K 9/00006; G06K 9/00013; G06K 9/0002;
(Continued)

(56) References Cited

U.S. PATENT DOCUMENTS 6,300,670 B1 * 10/2001 Kramer ............. H01L 21/76804
257/621
7,936,032 B2 * 5/2011 Huang ............... G06K 9/00026
257/415
(Continued)

FOREIGN PATENT DOCUMENTS

| TW | 200527665 | 8/2005 |
| TW | 201140467 | 11/2011 |
| TW | 201445699 | 12/2014 |

OTHER PUBLICATIONS

"Office Action of Taiwan Counterpart Application", dated Dec. 30, 2015, pp. 1-6.

*Primary Examiner* — Maliheh Malek
(74) *Attorney, Agent, or Firm* — Jianq Chyun IP Office

(57) ABSTRACT

A fingerprint sensor chip package structure including a circuit carrier and a fingerprint sensor chip is provided. The fingerprint sensor chip is disposed on the circuit carrier. The fingerprint sensor chip includes a chip body and a plurality of sensing structures. The chip body has an active surface, a fingerprint sensing back surface, a plurality of bond pads disposed on the active surface and a plurality of through holes. The chip body is electrically connected to the circuit carrier with the active surface facing the circuit carrier. The sensing structures are disposed in the through holes respectively. Each of the sensing structures includes a first dielectric layer, a first metal layer, a second dielectric layer and a second metal layer. The first dielectric layer is exposed on the fingerprint sensing back surface. The second metal layer extends to the active surface to be electrically connected to the corresponding bond pad.

10 Claims, 3 Drawing Sheets

(51) Int. Cl.
*H01L 23/488* (2006.01)
*H01L 21/768* (2006.01)

(52) U.S. Cl.
CPC ........... *H01L 2224/0401* (2013.01); *H01L 2224/11462* (2013.01); *H01L 2224/16227* (2013.01); *H01L 2224/32225* (2013.01); *H01L 2224/73204* (2013.01); *H01L 2224/92125* (2013.01); *H01L 2224/94* (2013.01); *H01L 2924/18161* (2013.01)

(58) Field of Classification Search
CPC ............ G06K 9/00053; G06K 9/0006; H01L 23/48–23/482; H01L 23/4824–23/4827; H01L 23/049; H01L 23/055; H01L 23/12–23/14; H01L 23/28; H01L 23/293–23/3157; H01L 23/3171; H01L 23/3185; H01L 23/50; H01L 23/535; H01L 23/538; H01L 23/5384; H01L 23/488; H01L 23/495–23/4952; H01L 23/498–23/49827; H01L 2224/0401; H01L 2224/11462; H01L 2224/16227; H01L 2224/32225; H01L 2224/73204; H01L 2224/94; H01L 2224/18161; H01L 2224/92125; H01L 2224/11; H01L 2224/03; H01L 21/70; H01L 21/768; H01L 21/76898
See application file for complete search history.

(56) References Cited

U.S. PATENT DOCUMENTS

| | | | | |
|---|---|---|---|---|
| 9,684,811 B2* | 6/2017 | Lin | | G06K 9/0002 |
| 2006/0214294 A1* | 9/2006 | Fukasawa | | G06K 9/00053 |
| | | | | 257/738 |
| 2006/0258053 A1* | 11/2006 | Lee | | H01L 24/18 |
| | | | | 438/118 |
| 2008/0187191 A1* | 8/2008 | Huang | | G06K 9/00053 |
| | | | | 382/124 |
| 2008/0191296 A1* | 8/2008 | Wang | | H01L 27/14625 |
| | | | | 257/432 |
| 2009/0039449 A1* | 2/2009 | Chou | | G06K 9/00053 |
| | | | | 257/415 |
| 2009/0315131 A1* | 12/2009 | Hung | | H01L 27/14621 |
| | | | | 257/432 |
| 2010/0096710 A1* | 4/2010 | Chou | | G06K 9/0002 |
| | | | | 257/414 |
| 2010/0113952 A1* | 5/2010 | Raguin | | G06K 9/0012 |
| | | | | 600/509 |
| 2011/0214924 A1* | 9/2011 | Perezselsky | | G06K 9/00053 |
| | | | | 178/18.03 |
| 2012/0105696 A1* | 5/2012 | Maeda | | H01L 21/76898 |
| | | | | 348/302 |
| 2013/0105214 A1* | 5/2013 | Kwon | | H05K 1/0296 |
| | | | | 174/266 |
| 2013/0194071 A1* | 8/2013 | Slogedal | | G06K 9/0002 |
| | | | | 340/5.82 |
| 2013/0203209 A1* | 8/2013 | Park | | H01L 27/14623 |
| | | | | 438/73 |
| 2014/0241595 A1* | 8/2014 | Bernstein | | G06K 9/0002 |
| | | | | 382/124 |
| 2014/0341448 A1* | 11/2014 | Chiu | | G06K 9/0002 |
| | | | | 382/124 |
| 2014/0347047 A1* | 11/2014 | Fu | | G01R 33/09 |
| | | | | 324/252 |
| 2014/0361395 A1* | 12/2014 | Bhagavat | | H01L 27/14634 |
| | | | | 257/448 |
| 2014/0369573 A1* | 12/2014 | Chiu | | G06K 9/00013 |
| | | | | 382/124 |
| 2015/0036065 A1* | 2/2015 | Yousefpor | | G06K 9/228 |
| | | | | 349/12 |
| 2015/0296622 A1* | 10/2015 | Jiang | | G01L 1/2268 |
| | | | | 361/750 |
| 2015/0311376 A1* | 10/2015 | Yu | | H01L 31/02327 |
| | | | | 257/432 |
| 2015/0347806 A1* | 12/2015 | Li | | H01L 24/17 |
| | | | | 257/414 |
| 2016/0042217 A1* | 2/2016 | Kim | | G06F 3/041 |
| | | | | 382/124 |
| 2016/0148035 A1* | 5/2016 | Bredholt | | G06K 9/00053 |
| | | | | 382/124 |
| 2016/0154989 A1* | 6/2016 | Lin | | G06K 9/00053 |
| | | | | 382/124 |
| 2016/0171273 A1* | 6/2016 | Ho | | G06K 9/0002 |
| | | | | 324/658 |
| 2016/0190198 A1* | 6/2016 | Kwon | | H01L 27/14612 |
| | | | | 257/435 |
| 2016/0204061 A1* | 7/2016 | Yiu | | H01L 21/268 |
| | | | | 257/774 |
| 2016/0211204 A1* | 7/2016 | Hu | | H01L 23/49822 |
| 2016/0212851 A1* | 7/2016 | Hu | | H01L 23/5389 |
| 2016/0224819 A1* | 8/2016 | Kim | | G06K 9/0004 |
| 2016/0232397 A1* | 8/2016 | Yu | | G06K 9/00053 |
| 2016/0253540 A1* | 9/2016 | Han | | G06K 9/00 |
| 2016/0268326 A1* | 9/2016 | Yu | | H01L 27/14618 |
| 2016/0275333 A1* | 9/2016 | Lin | | G06K 9/00053 |
| 2016/0278671 A1* | 9/2016 | Bhagavat | | A61B 5/1172 |
| 2016/0282987 A1* | 9/2016 | Choi | | G06F 3/044 |
| 2016/0283776 A1* | 9/2016 | Chang | | G06K 9/0002 |
| 2016/0291176 A1* | 10/2016 | Yu | | G01H 11/06 |
| 2016/0295691 A1* | 10/2016 | Furuta | | G06F 3/041 |
| 2016/0300096 A1* | 10/2016 | Kim | | G06K 9/0002 |
| 2016/0342823 A1* | 11/2016 | Lee | | G06K 9/0002 |
| 2017/0032164 A1* | 2/2017 | Liu | | G06K 9/0002 |
| 2017/0033139 A1* | 2/2017 | Lu | | H01L 27/14621 |
| 2017/0061187 A1* | 3/2017 | Wen | | G06K 9/0002 |
| 2017/0092622 A1* | 3/2017 | Wu | | H01L 25/0657 |
| 2017/0115363 A1* | 4/2017 | Jiang | | G01R 33/091 |
| 2017/0148756 A1* | 5/2017 | Yu | | H01L 24/32 |
| 2017/0177917 A1* | 6/2017 | Pant | | G06K 9/0002 |

* cited by examiner

FINGERPRINT SENSOR CHIP PACKAGE STRUCTURE AND MANUFACTURING METHOD THEREOF

CROSS-REFERENCE TO RELATED APPLICATION

This application claims the priority benefit of Taiwan application serial no. 104118906, filed on Jun. 11, 2015. The entirety of the above-mentioned patent application is hereby incorporated by reference herein and made a part of this specification.

BACKGROUND OF THE INVENTION

1. Field of the Invention

The present invention relates to a chip package structure and manufacturing method thereof, and more specifically to a fingerprint sensor chip package structure and manufacturing method thereof.

2. Description of Related Art

Fingerprint sensor chip packages may be installed in a variety of electronic devices, such as smart phones, mobile phones, tablets, laptops, and personal digital assistants (PDA), to identify a user's fingerprint. Modern fingerprint sensor chip packaging may roughly be separated into the packaging with a flexible printed circuit board and the packaging with a rigid printed circuit board. The fingerprint sensor chip package structure with the flexible printed circuit board usually has the sensing circuits for identifying the user's fingerprint being disposed on the flexible printed circuit board, and the user processes the fingerprint identification by touching the sensing circuits located on the flexible printed circuit board. However, the signals in this package type are transmitted to the fingerprint sensor chip through the sensing circuits located on the flexible printed circuit board such that the reaction speed would be slower compared to the package type with the fingerprint identification undertaken directly on the fingerprint sensor chip.

The other common fingerprint sensor chip package structure mainly comprises a circuit carrier, a fingerprint sensor chip, a plurality of bonding wires, and an encapsulant. A sensing area for identifying the user's fingerprint is usually located on the active surface of the fingerprint sensor chip. The fingerprint sensor chip is normally bonded to the circuit carrier with its back surface, and electrically connected to the circuit carrier with the bonding wires coupling the active surface of the fingerprint sensor chip and the circuit carrier. Therefore, the encapsulant formed on the circuit carrier would cover the bonding wires and part of the fingerprint sensor chip, and expose the sensing area on the active surface of the fingerprint sensor chip. The loop height of the bonding wires restrains the decrease in the thickness of the encapsulant, causing difficulty in reduction of the overall thickness of the fingerprint sensor chip package structure. Moreover, since the user would repeatedly touch the sensing area, the bonding wires are likely to break off from the fingerprint sensor chip or the circuit carrier, thereby decreasing the sensing sensitivity of the fingerprint sensor chip package structure, or even leading to malfunction or damage. In addition, there are the upper metal layer and bond pads of the integrated circuits, and the passivation layer covering the upper metal layer disposed on the active surface of the fingerprint sensor chip. These protruding upper metal layer and bond pads make the active surface uneven. When the user touches the active surface with his or her finger, the uneven active surface is likely to cause the fingerprint identification difficult or to decrease the sensing sensitivity.

SUMMARY OF THE INVENTION

The present invention provides a fingerprint sensor chip package structure, which has better sensing sensitivity.

The present invention provides a method of forming a fingerprint sensor chip package structure, which meets the design requirement for thinness.

The present invention provides a fingerprint sensor chip package structure, which comprises a circuit carrier and a fingerprint sensor chip disposed on the circuit carrier. The fingerprint sensor chip includes a chip body and a plurality of sensing structures. The chip body has an active surface, a fingerprint sensing back surface opposite to the active surface, a plurality of bond pads disposed on the active surface, and a plurality of through holes penetrating the active surface and the fingerprint sensing back surface. The chip body is electrically connected to the circuit carrier with the active surface facing the circuit carrier. The sensing structures are disposed in the through holes respectively. Each of the sensing structures comprises a first dielectric layer, a first metal layer, a second dielectric layer, and a second metal layer. The first dielectric layer is exposed on the fingerprint sensing back surface. The first metal layer connects the first dielectric layer. The second dielectric layer connects the first metal layer. The second metal layer connects the second dielectric layer, and extends to the active surface to be electrically connected to the bond pad corresponding thereto.

The present invention provides a method of forming a fingerprint sensor chip package structure, which comprises the following steps. A semiconductor substrate is provided. The semiconductor substrate includes an active surface, a back surface opposite to the active surface, and a plurality of bond pads disposed on the active surface. A plurality of blind holes are formed on the active surface. A first dielectric layer, a first metal layer, a second dielectric layer, and a second metal layer are formed in each of the blind holes in sequence, and each of the second metal layers is extended to the active surface to be electrically connected to one of the bond pads respectively. The first dielectric layer, the first metal layer, the second dielectric layer, and the second metal layer in each of the blind holes constitute a sensing structure. The back surface of the semiconductor substrate is thinned to form a fingerprint sensing back surface that exposes the first dielectric layers. The semiconductor substrate is diced to form a plurality of fingerprint sensor chips. Each of the fingerprint sensor chips comprises a plurality of the sensing structures. At least one of the fingerprint sensor chips is electrically connected to a circuit carrier with the active surface facing the circuit carrier.

In view of the above, the fingerprint sensor chip package structure of the present invention is constructed by disposing the sensing area for identifying the user's fingerprint on the back surface of the fingerprint sensor chip, and electrically connecting the active surface of the fingerprint sensor chip to the circuit carrier in a flip-chip manner. Compared to a conventional fingerprint sensor chip package in which the sensing area is disposed on the active surface of the fingerprint sensor chip, and the active surface of the fingerprint sensor chip is electrically connected to the circuit carrier in a wire bonding manner, the fingerprint sensor chip package structure of the present invention could avoid the deterioration of the sensing sensitivity caused by breakage of the bonding wires due to repeated touching on the sensing area by the user, thereby having a better reliability. Moreover, since the fingerprint sensor chip package structure of the present invention does not need bonding wires for electrically connecting the active surface of the fingerprint sensor chip and the circuit carrier, the thickness of the encapsulant can be decreased so as to meet the design requirement for thinness.

On the other hand, the fingerprint sensor chip of the present invention has capacitance sensing structures embedded therein, and the sensing area is defined by the parts of the capacitance sensing structures exposed on the fingerprint sensing back surface of the fingerprint sensor chip (i.e. the first dielectric layer). That is, the user is touching the sensing area located on the fingerprint sensing back surface with his/her finger such that the distance difference between the sensing structures and the fingerprint ridges and valleys results in a change of capacitance, and the change of capacitance detected is then converted to fingerprint image for identification. Because the fingerprint sensing back surface is formed by thinning/grinding the back surface of the semiconductor substrate, and there is no circuit disposed on the fingerprint sensing back surface, it hence has better surface evenness and structural strength so that the sensing sensitivity can be enhanced.

In order to make the aforementioned and other objects, features and advantages of this invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
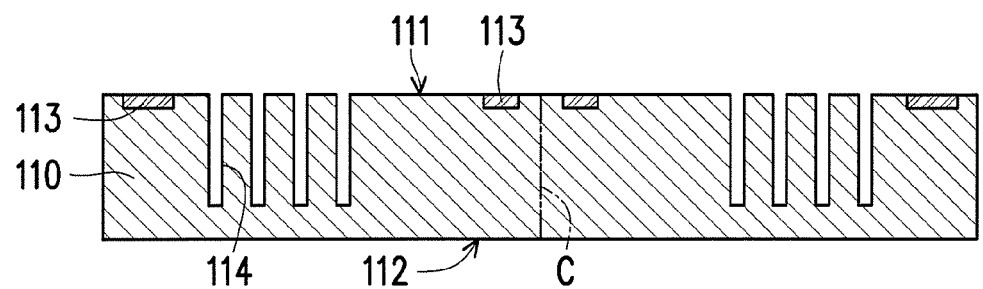
FIG. 1A to FIG. 1F show processes of manufacturing a fingerprint sensor chip package structure according to an embodiment of the present invention.

FIG. 1A to FIG. 1F show processes of manufacturing a fingerprint sensor chip package structure according to an embodiment of the present invention. Referring to FIG. 1A, a semiconductor substrate 110, for example, a silicon substrate is first provided. The semiconductor substrate 110 includes an active surface 111, a back surface 112 opposite to the active surface 111, and a plurality of bond pads 113 disposed on the active surface 111. Specifically, the semiconductor substrate 110 includes integrated circuits. The integrated circuits lie close to the active surface 111, and are composed of a plurality of metal layers and dielectric layers alternately stacking with each other from inside the semiconductor substrate 110, and form an upper metal layer and bond pads 113 on the active surface 111. In addition, the semiconductor substrate 110 further includes a passivation layer which covers the upper metal layer and exposes the bond pads 113. A material of the bond pads 113 may be aluminium, copper, silver, nickel, gold, or other suitable conductive metals. Then, a plurality of blind holes 114 are formed on the active surface 111 by means of laser drilling or mechanical drilling for example. In other words, the openings of these blind holes 114 are exposed on the active surface 111 of the semiconductor substrate 110. In the embodiments which are not illustrated, looking down on top of the active surface 111 of the semiconductor substrate 110, the arrangement of these blind holes 114 may be in an array pattern, a linear pattern, a circular pattern, a radial pattern, a fan-shaped pattern, a cross-shaped pattern, or other suitable patterns, depending on the design requirements.

Figure 1B:
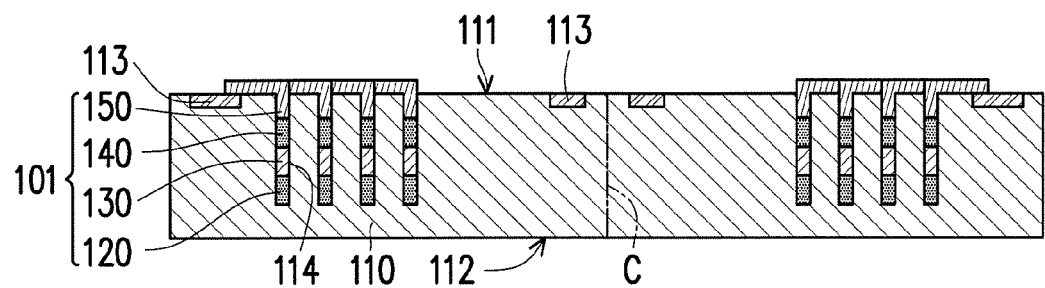

Then, referring to FIG. 1B, a first dielectric layer 120, a first metal layer 130, a second dielectric layer 140, and a second metal layer 150 are formed in sequence in each of the blind holes 114, and each of the second metal layers 150 extends to the active surface 111 to be electrically connected to one of the bond pads 113 respectively. Specifically, the first dielectric layer 120, the first metal layer 130, the second dielectric layer 140, and the second metal layer 150 may be formed by means of, for example, physical vapor deposition or chemical vapor deposition from a bottom to the opening of each of the blind holes 114 in sequential order. That is, each of the first dielectric layers 120 contacts the bottom of the corresponding blind hole 114, each of the first metal layers 130 connects the corresponding first dielectric layer 120 and the second dielectric layer 140, and each of the second dielectric layers 140 connects the second metal layer 150 exposed from the corresponding blind hole 114.

Here, a material of the first dielectric layer 120 comprises high dielectric constant (high k) material, such as silicon nitride ($Si_3N_4$), aluminium oxide ($Al_2O_3$), Hafnium(IV) oxide ($HfO_2$), Yttrium oxide ($Y_2O_3$), Lanthanum oxide ($La_2O_3$), Cerium(IV) oxide ($CeO_2$), Dysprosium oxide ($Dy_2O_3$), Tantalum pentoxide ($Ta_2O_5$), Praseodymium(III) oxide ($Pr_2O_3$), Titanium dioxide ($TiO_2$), or Zirconium dioxide ($ZrO_2$). On the other hand, a material of the second dielectric layer 140 may also be high dielectric constant material. In general, the first metal layer 130 and the second metal layer 150 may be made of copper, silver, tin, aluminium, nickel, gold, or other suitable conductive metals. The first dielectric layer 120, the first metal layer 130, the second dielectric layer 140, and the second metal layer 150 in each of the blind holes 114 constitute a sensing structure 101, which may be, for example, a capacitance sensing structure. Specifically, in each of the blind holes 114 the first metal layer 130 and the second metal layer 150 are separated by the second dielectric layer 140 to form a capacitor-like structure.

Figure 1C:
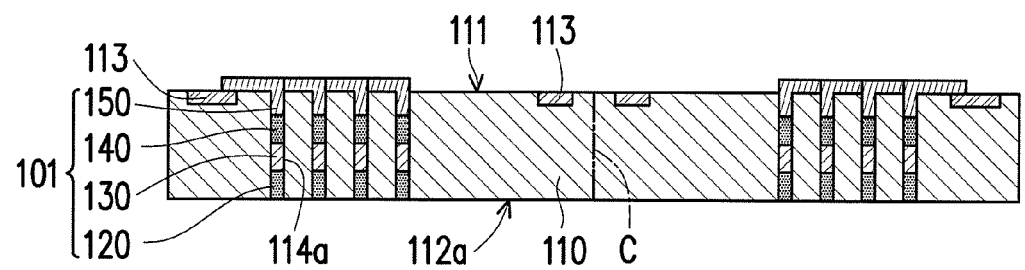

Then, referring to FIG. 1C, a thinning process (e.g., chemical mechanical polishing) is performed to the back surface 112 of the semiconductor substrate 110, so as to expose the first dielectric layers 120 after thinning the semiconductor substrate 110. The surface of the semiconductor substrate 110 exposing the first dielectric layers 120 after the thinning process is called the fingerprint sensing back surface 112a, and the holes which contain the first dielectric layers 120, the first metal layers 130, the second dielectric layers 140, and the second metal layers 150 become through holes 114a which penetrate the active surface 111 and the fingerprint sensing back surface 112a.

Figure 1D:
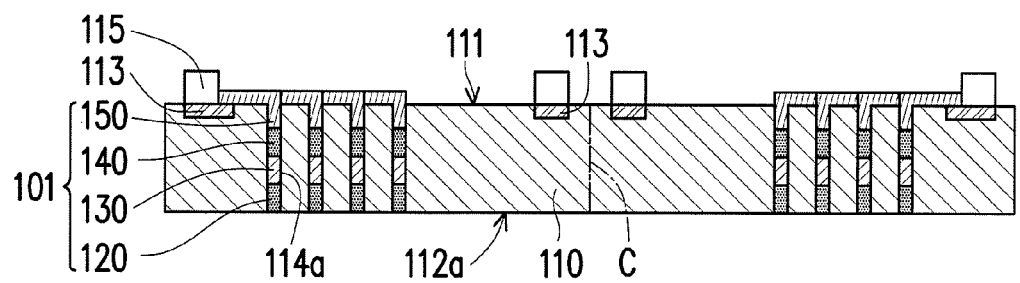
Figure 1E:
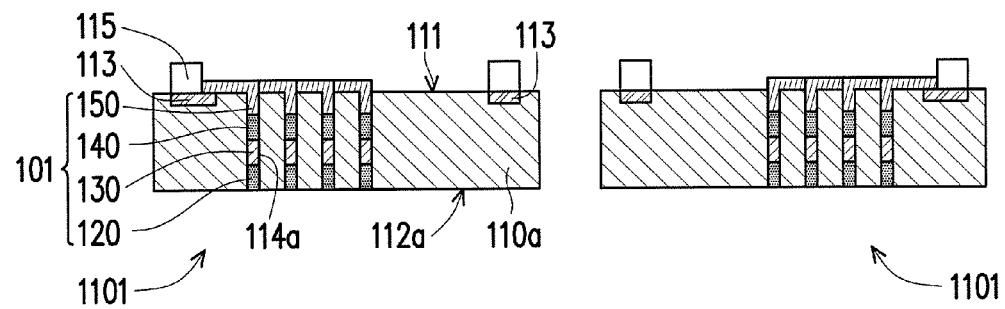

Next, referring to FIG. 1D, a plurality of bumps 115 are formed on the active surface 111 by means of, for example, electroplating, and these bumps 115 are respectively connected to the bond pads 113. In general, a material of the bumps 115 may be gold, copper, or other suitable conductive metals. Then, referring to FIG. 1E, the semiconductor substrate 110 is diced along the scribe line C by means of, for example, laser dicing or mechanical dicing to form a plurality of fingerprint sensor chips 1101 (only two of them schematically illustrated in FIG. 1E). Specifically, each of the fingerprint sensor chips 1101 comprises a chip body 110a and a plurality of the sensing structures 101 embedded in the chip body 110a. The chip body 110a includes an active surface 111, a fingerprint sensing back surface 112a opposite to the active surface 111, a plurality of bond pads 113 disposed on the active surface 111, and a plurality of through holes 114a penetrating the active surface 111 and the fingerprint sensing back surface 112a. The sensing structures 101 are embedded in the through holes 114a. The first dielectric layer 120 of each of the sensing structures 101 is exposed on the fingerprint sensing back surface 112a. The second metal layer 150 of each of the sensing structures 101 is exposed on the active surface 111.

Figure 1F:
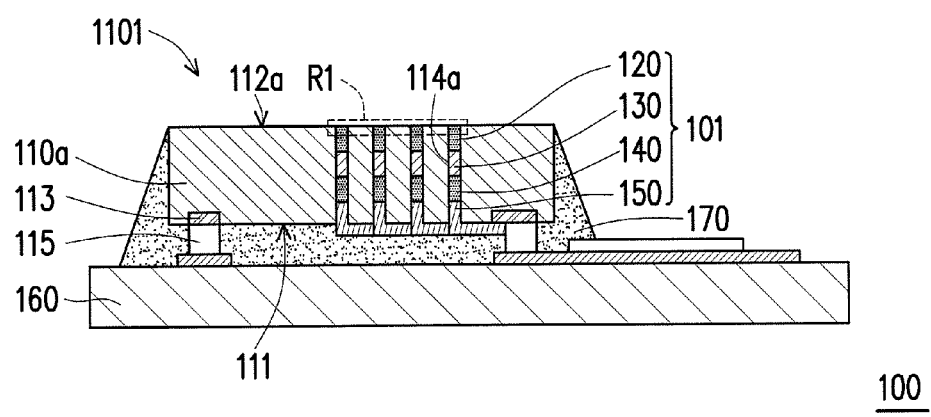

Thereafter, referring to FIG. 1F, at least one of the fingerprint sensor chips 1101 (only one illustrated in FIG. 1F) is electrically connected to a circuit carrier 160. Specifically, the fingerprint sensor chip 1101 may be bonded to a patterned circuit layer on the circuit carrier 160 through the bumps 115 in a flip-chip manner for example, so as to be electrically connected to the circuit carrier 160. In the present embodiment, the circuit carrier 160 may be a flexible printed circuit board. After bonding the fingerprint sensor chip 1101 on the circuit carrier 160, an encapsulant 170 may be formed on the circuit carrier 160. The encapsulant 170 at least fills in between the active surface 111 of the fingerprint sensor chip 1101 and the circuit carrier 160 in order to protect the electrical contacts between the fingerprint sensor chip 1101 and the circuit carrier 160, and the encapsulant 170 exposes the fingerprint sensing back surface 112a of the fingerprint sensor chip 1101. Hereto, the manufacturing of a fingerprint sensor chip package structure 100 is mostly completed.

Compared to a conventional fingerprint sensor chip package, in which the sensing area is disposed on the active surface of the fingerprint sensor chip, and the fingerprint sensor chip is electrically connected to the circuit carrier by wire bonding the active surface thereof to the circuit carrier, in the fingerprint sensor chip package structure 100 of the present embodiment, the fingerprint sensor chip 1101 is electrically connected to the circuit carrier 160 in a flip-chip manner, thus deterioration of the sensing sensitivity of the fingerprint sensor chip package structure caused by breakage of the bonding wires due to repeated touching on the sensing area by the user can be avoided. In other words, the fingerprint sensor chip package structure 100 of the present embodiment has a better reliability. On the other hand, since bonding wires are not necessary for electrically connecting the active surface 111 of the fingerprint sensor chip 1101 to the circuit carrier 160 in the fingerprint sensor chip package structure 100 of the present embodiment, the thickness of the encapsulant 170 can hence be decreased so as to meet the design requirement for thinness.

Still referring to FIG. 1F, each of the first dielectric layers 120 is exposed on the fingerprint sensing back surface 112a, and a side surface of each of the first dielectric layers 120 exposed on the fingerprint sensing back surface 112a is coplanar with the fingerprint sensing back surface 112a. Moreover, the first dielectric layers 120 define a sensing area R1 on the fingerprint sensing back surface 112a. When the user touches the sensing area R1 with his or her finger, the distance difference between the sensing structures 101 and the fingerprint ridges and valleys results in a change of capacitance, and the change of capacitance detected is then converted to fingerprint image for identification. Since the sensing structures 101 of the present embodiment are disposed directly in the fingerprint sensor chip 1101, compared to the conventional fingerprint sensor chip package in which the sensing area is disposed on the flexible printed circuit board, the electrical transmission distance of the fingerprint sensor chip package structure 100 of the present embodiment is shorter, and thus it has a faster reaction speed and better sensing sensitivity. Moreover, since the sensing area R1 of the present embodiment is located on the fingerprint sensing back surface 112a, compared to the conventional fingerprint sensor chip package in which the sensing area is disposed on the active surface of the fingerprint sensor chip, the fingerprint sensing back surface 112a has better surface evenness and structural strength, thereby improving the sensing sensitivity. In the embodiments which are not illustrated, the arrangement of the first dielectric layers 120 of the sensing structures 101 in the sensing area R1 may be in an array pattern, a linear pattern, a circular pattern, a radial pattern, a fan-shaped pattern, a cross-shaped pattern, or other suitable patterns, depending on the design requirements.

In view of the above, the fingerprint sensor chip package structure of the present invention is constructed by disposing the sensing area for identifying the user's fingerprint on the back surface of the fingerprint sensor chip, and electrically connecting the active surface of the fingerprint sensor chip to the circuit carrier in a flip-chip manner. Compared to a conventional fingerprint sensor chip package in which the sensing area is disposed on the active surface of the fingerprint sensor chip, and the active surface of the fingerprint sensor chip is electrically connected to the circuit carrier in a wire bonding manner, the fingerprint sensor chip package structure of the present invention could avoid the deterioration of the sensing sensitivity caused by breakage of the bonding wires due to repeated touching on the sensing area by the user, thereby having a better reliability. Moreover, since the fingerprint sensor chip package structure of the present invention does not need bonding wires for electrically connecting the active surface of the fingerprint sensor chip and the circuit carrier, the thickness of the encapsulant can be decreased so as to meet the design requirement for thinness.

On the other hand, the fingerprint sensor chip of the present invention has capacitance sensing structures embedded therein, and the sensing area is defined by the parts of the capacitance sensing structures exposed on the fingerprint sensing back surface of the fingerprint sensor chip (i.e., the first dielectric layer). That is, the user is touching the sensing area located on the fingerprint sensing back surface with his or her finger such that the distance difference between the sensing structures and the fingerprint ridges and valleys results in a change of capacitance, and the change of capacitance detected is then converted to fingerprint image for identification. Because the fingerprint sensing back surface is formed by thinning or grinding the back surface of the semiconductor substrate, and there is no circuit disposed on the fingerprint sensing back surface, it hence has better surface evenness and structural strength so that the sensing sensitivity can be enhanced.

Although the present invention is disclosed as embodiments mentioned above, it is not meant to restrict the present invention. It will be apparent to those skilled in the art that various modifications and variations can be made to the structure of the present invention without departing from the scope or spirit of the invention. Therefore, the scope of the present invention should be defined by the following claims.

What is claimed is:
1. A fingerprint sensor chip package structure, comprising:
   a circuit carrier; and
   a fingerprint sensor chip, disposed on the circuit carrier, the fingerprint sensor chip comprising:

a chip body, having an active surface, a fingerprint sensing back surface opposite to the active surface, a plurality of bond pads disposed on the active surface, and a plurality of through holes penetrating the active surface and the fingerprint sensing back surface, wherein the chip body is electrically connected to the circuit carrier with the active surface facing the circuit carrier; and a plurality of sensing structures respectively disposed in the through holes, each of the sensing structures comprising:

a first dielectric layer, exposed on the fingerprint sensing back surface;

a first metal layer, connecting the first dielectric layer;

a second dielectric layer, connecting the first metal layer; and a second metal layer, connecting the second dielectric layer, the second metal layer extending to the active surface to be electrically connected to the bond pad corresponding thereto.

2. The fingerprint sensor chip package structure as claimed in claim 1, further comprising:

an encapsulant, at least formed between the active surface of the fingerprint sensor chip and the circuit carrier, and exposing the fingerprint sensing back surface of the fingerprint sensor chip.

3. The fingerprint sensor chip package structure as claimed in claim 1, wherein the first dielectric layers define a sensing area on the fingerprint sensing back surface.

4. The fingerprint sensor chip package structure as claimed in claim 1, wherein a material of the first dielectric layers comprises a high dielectric constant material.

5. The fingerprint sensor chip package structure as claimed in claim 4, wherein the high dielectric constant material comprises silicon nitride, aluminium oxide, Hafnium(IV) oxide, Yttrium oxide, Lanthanum oxide, Cerium (IV) oxide, Dysprosium oxide, Tantalum pentoxide, Praseodymium(III) oxide, Titanium dioxide, or Zirconium dioxide.

6. The fingerprint sensor chip package structure as claimed in claim 1, wherein a side surface of each of the first dielectric layers exposed on the fingerprint sensing back surface is coplanar with the fingerprint sensing back surface.

7. The fingerprint sensor chip package structure as claimed in claim 1, further comprising:

a plurality of bumps, respectively connected to the bond pads, wherein the fingerprint sensor chip is bonded to the circuit carrier through the bumps in a flip-chip manner.

8. A method of forming a fingerprint sensor chip package structure, comprising:

providing a semiconductor substrate, the semiconductor substrate includes an active surface, a back surface opposite to the active surface, and a plurality of bond pads disposed on the active surface;

forming a plurality of blind holes on the active surface;

forming a first dielectric layer, a first metal layer, a second dielectric layer, and a second metal layer in each of the blind holes in sequence, and having each of the second metal layers extending to the active surface to be electrically connected to one of the bond pads respectively, the first dielectric layer, the first metal layer, the second dielectric layer, and the second metal layer in each of the blind holes constituting a sensing structure;

thinning the back surface of the semiconductor substrate to form a fingerprint sensing back surface that exposes the first dielectric layers;

dicing the semiconductor substrate to form a plurality of fingerprint sensor chips, each of the fingerprint sensor chips comprises a plurality of the sensing structures; and electrically connecting at least one of the fingerprint sensor chips to a circuit carrier with the active surface facing the circuit carrier.

9. The method of forming a fingerprint sensor chip package structure as claimed in claim 8, further comprising:

after thinning the back surface of the semiconductor substrate to form the fingerprint sensing back surface that exposes the first dielectric layers, forming a plurality of bumps on the active surface, wherein the bumps are respectively connected to the bond pads, and the fingerprint sensor chip is bonded to the circuit carrier through the bumps in a flip-chip manner.

10. The method of forming a fingerprint sensor chip package structure as claimed in claim 8, further comprising:

forming an encapsulant at least filling in between the active surface of the fingerprint sensor chip and the circuit carrier, and exposing the fingerprint sensing back surface of the fingerprint sensor chip.

* * * * *